United States Patent
Asenov et al.

(10) Patent No.: US 9,324,392 B1
(45) Date of Patent: Apr. 26, 2016

(54) MEMORY DEVICE AND METHOD OF PERFORMING A WRITE OPERATION IN A MEMORY DEVICE

(71) Applicant: ARM LIMITED, Cambridge (GB)

(72) Inventors: Plamen Asenov Asenov, Cambridge (GB); David Anthony New, Cambridge (GB); Paul Darren Hoxey, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/521,635

(22) Filed: Oct. 23, 2014

(51) Int. Cl.
| | |
|---|---|
| *G11C 8/00* | (2006.01) |
| *G11C 7/12* | (2006.01) |
| *G11C 7/22* | (2006.01) |
| *G11C 8/08* | (2006.01) |
| G11C 8/18 | (2006.01) |

(52) U.S. Cl.
CPC .. *G11C 7/12* (2013.01); *G11C 7/22* (2013.01); *G11C 8/08* (2013.01); *G11C 8/18* (2013.01)

(58) Field of Classification Search
CPC .... G11C 11/4076; G11C 11/419; G11C 7/22; G11C 7/1072; G11C 7/1078; G11C 8/08; G11C 16/12; G11C 8/14; G11C 8/18
USPC ................ 365/230.06, 189.16, 189.09, 233.1
See application file for complete search history.

(56) References Cited

U.S. PATENT DOCUMENTS

| | | | | |
|---|---|---|---|---|
| 8,908,418 B2 * | 12/2014 | Yabuuchi | ............. | G11C 11/419 365/154 |
| 8,995,208 B2 * | 3/2015 | Jung | .................... | G11C 11/413 365/154 |
| 9,048,192 B2 * | 6/2015 | Kim | .................... | H01L 21/3065 |

OTHER PUBLICATIONS

N. Shibata et al., "A 0.5-V 25-Mhz 1-mW 256-Kb MTCMOS/SOI SRAM for Solar-Power-Operated Portable Personal Digital Equipment-Sure Write Operation by Using Step-Down Negatively Overdriven Bitline Scheme", IEEE Journal of Solid-State Circuits, vol. 41, No. 3, Mar. 2006, pp. 728-742.
S. Mukhopadhyay et al., "Capacitive Coupling Based Transient Negative Bit-line Voltage (TRAN-NBL) Scheme for Improving Write-Ability of SRAM Design in Nanometer Technologies", ECE Dept, Georgia Institute of Technology, Atlanta GA, IEEE, 2008, pp. 384-387.

(Continued)

*Primary Examiner* — David Lam
(74) *Attorney, Agent, or Firm* — Nixon & Vanderhye P.C.

(57) ABSTRACT

The present invention provides a technique for performing write operations within a memory device comprising an array of memory cells. Wordline driver circuitry is used to assert a wordline signal to activate an addressed memory cell in the array. Write driver circuitry is used to perform a write operation to write a data value into the addressed memory cell, and is responsive to assertion of a write assist enable signal during the write operation to implement a write assist mechanism. Further, control circuitry is used to control timing of assertion of the wordline signal in dependence on timing of assertion of the write assist enable signal. By making the timing of assertion of the wordline signal dependent on the timing at which the write assist enable signal is asserted, it has been found that writeability of the memory cells is significantly improved.

16 Claims, 12 Drawing Sheets

(56) References Cited

OTHER PUBLICATIONS

K. Nii et al., "A 45-nm Single port and Dual-port SRAM family with Robust Read/Write Stabilizing Circuitry under DVFS Environment", 2008 Symposium on VLSI Circuits Digest of Technical Papers, IEEE, 2008, pp. 212-213.

V. Chandra et al., "On the Efficacy of Write-Assist Techniques in Low Voltage Nanoscale SRAMs", EDAA, 2010, pp. 345-350.

\* cited by examiner

MEMORY DEVICE AND METHOD OF PERFORMING A WRITE OPERATION IN A MEMORY DEVICE

BACKGROUND

The present invention relates to a memory device and to a method of performing a write operation in such a memory device.

When performing write operations in modern memory devices, it is becoming more and more common to use write assist mechanisms in order to improve the writeability of the memory cells being written to. Many of the known write assist techniques involve applying boost voltages either greater than the normal supply voltage, or below the normal ground voltage. One particular approach is the negative bitline boost (NBLB) approach, which is typically a capacitive based approach, and is regarded as one of the most effective ways of boosting writeability of a memory cell.

In modern memory devices, it is also common to use a different voltage supply for the memory cells within the memory array than the voltage supply that is used for much of the associated access circuitry used to perform write operations and read operations within the memory cells of the memory array. In particular, the memory cells of the memory array may be powered by a cell voltage supply (VDDCE), whilst much of the remaining access circuitry is operated from a peripheral voltage supply (VDDPE). By taking such an approach, it is possible to save significant power, since for example the peripheral voltage supply can be turned off whilst the memory is in a retention state. In order to reduce leakage current, it is desirable to place much of the access logic within the peripheral voltage domain, and accordingly it is common for the components used to implement the write assist mechanism to be operated from the peripheral voltage domain.

It is typically the case that when high performance is not required, the peripheral voltage supply can be reduced to a level below that of the cell voltage supply, thereby enabling significant power consumption benefits to be realised. However, as the difference between the peripheral voltage supply and the cell voltage supply becomes larger, this can significantly adversely reduce the effect of the write assist mechanism due to that write assist mechanism operating from the peripheral voltage supply. As a particular example, considering a capacitive based negative bitline boost mechanism, the capacitive boost is dependent on the peripheral voltage supply, and accordingly as the peripheral voltage supply is reduced, the amount of the boosting effect is reduced. This can lead to a significant reduction in the writeability of the memory cells even in memory devices that incorporate write assist mechanisms. Accordingly, it would be desirable to improve the writeability of memory cells.

SUMMARY

Viewed from a first aspect, there is provided a memory device comprising: an array of memory cells; wordline driver circuitry to assert a wordline signal to activate an addressed memory cell in the array; write driver circuitry to perform a write operation to write a data value into the addressed memory cell, and responsive to assertion of a write assist enable signal during the write operation to implement a write assist mechanism; and control circuitry to control timing of assertion of the wordline signal in dependence on timing of assertion of the write assist enable signal.

Viewed from a second aspect, there is provided a method of performing a write operation within a memory device having an array of memory cells, comprising: employing wordline driver circuitry to assert a wordline signal to activate an addressed memory cell in the array; performing the write operation to write a data value into the addressed memory cell, and responsive to assertion of a write assist enable signal during the write operation to implement a write assist mechanism; and controlling timing of assertion of the wordline signal in dependence on timing of assertion of the write assist enable signal.

Viewed from a third aspect, there is provided a memory device comprising: an array of memory cell means; wordline driver means for asserting a wordline signal to activate an addressed memory cell means in the array; write driver means for performing a write operation to write a data value into the addressed memory cell means and, responsive to assertion of a write assist enable signal during the write operation, for implementing a write assist mechanism; and control means for controlling timing of assertion of the wordline signal in dependence on timing of assertion of the write assist enable signal.

Viewed from a fourth aspect, there is provided a non-transitory computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device in accordance with the above mentioned first aspect.

BRIEF DESCRIPTION OF THE DRAWINGS

The present technique will be described further, by way of example only, with reference to embodiments thereof as illustrated in the accompanying drawings, in which.

DESCRIPTION OF EXAMPLE EMBODIMENTS

Figure 1:
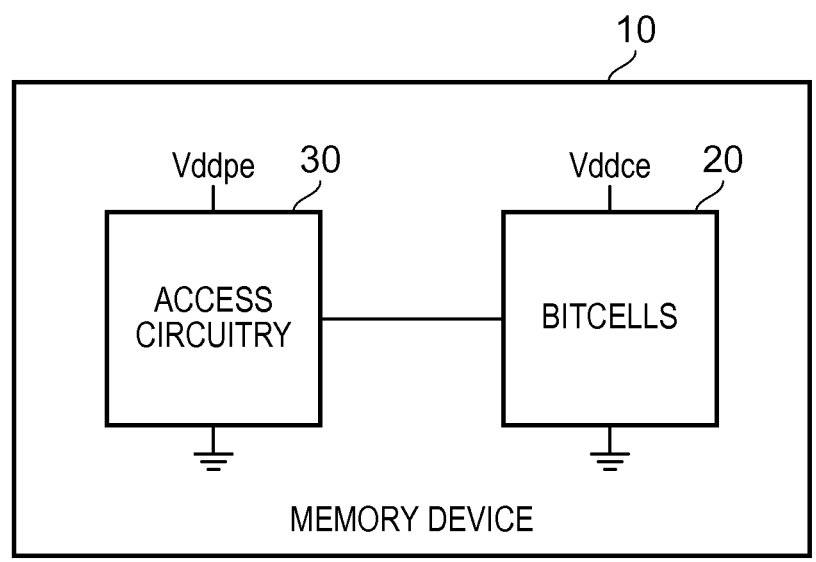
FIG. 1 schematically illustrates a memory device in which the techniques of the described embodiments may be employed.

Before discussing the embodiments with reference to the accompanying figures, the following description of embodiments and associated advantages is provided.

In accordance with one embodiment, whilst the write driver circuitry is performing a write operation, the wordline signal used to activate an addressed memory cell for the write operation is not initially asserted. Instead, the write operation implements a write assist mechanism which is activated at a certain point during the performance of the write operation in response to assertion of a write assist enable signal. The control circuitry is then used to control the timing of assertion of the wordline signal in dependence on the timing of assertion of the write assist enable signal. By such an approach, it has been found that certain effects that would otherwise compromise the effective performance of the write operation are avoided, improving the writeability of the addressed memory cell. Further, it has been found that even though the wordline signal is then asserted later than it would previously have been asserted in accordance with known techniques, this does not adversely affect the performance of write operations, since at the time the wordline signal is asserted the write operation can then be completed quickly.

In one embodiment, the control circuitry is arranged to assert the wordline signal on or after the write assist enable signal is asserted. Even though in such embodiments the wordline signal is not asserted until a relatively late stage in the performance of the write operation, it has been found that the absence of asserting the wordline signal earlier during the write operation leads to improved writeability, and accordingly the write operation can then be completed very quickly after the write assist mechanism has been activated and the wordline signal has been asserted. Hence, the technique can be implemented without any adverse effect on the performance of the write operations, whilst the writeability of the memory cells is increased.

The write assist mechanism can take a variety of forms. However, in one embodiment, the addressed memory cell is connected to at least one bitline, the write driver circuitry performs the write operation by controlling a voltage on the at least one bitline, and the write assist mechanism is a bitline boosting mechanism.

In one embodiment, the addressed memory cell is connected to a pair of bitlines, and the write driver circuitry comprises writing circuitry to drive a voltage on one of the bitlines in the pair from a first voltage level to a second voltage level during the writing operation and write assist circuitry responsive to the write assist enable signal to implement the bitline boosting mechanism to drive the voltage on said one of the bitlines beyond the second voltage level so as to increase a voltage difference between the voltage level on said one of the bitlines and said first voltage level. Hence, the aim of the bitline boosting mechanism is to increase the differential between the voltage level on the two bitlines in order to improve writeability.

In one embodiment, the first voltage level is a precharge voltage level to which both bitlines in the pair are precharged prior to the write operation.

In one embodiment, the control circuitry comprises write assist enable signal generation circuitry to time assertion of the write assist enable signal so as to ensure that the writing circuitry will have caused the voltage on said one of the bitlines in the pair to have reached the second voltage level before the write assist enable signal is asserted. Such an approach maximises the benefit of the write assist mechanism, since no part of the additional boost is wasted in completing the transition to the second voltage level, and all of the boost can be used to transition the voltage beyond the second voltage level.

The write assist enable generation circuitry can be configured in a variety of ways, but in one embodiment comprises dummy bitline circuitry to introduce a delay in the assertion of the write assist enable signal to take account of the time taken for the writing circuitry to drive the voltage on said one of the bitlines from the first voltage level to the second voltage level. This enables the timing of the generation of the write assist enable signal to track with the memory array height. In particular, the larger the memory array size, and in particular the larger the number of memory cells connected to each pair of bitlines, the longer it will take for the writing circuitry to transition the voltage on one of the bitlines to the second voltage level during the write operation. However, through the use of dummy bitline circuitry which mimics the loading of the bitline in the real memory array, the delay introduced in asserting the write assist enable signal will take account of the memory array size.

In one embodiment, the control circuitry asserts the wordline signal on or after the write assist enable signal is asserted, thereby ensuring that the addressed memory cell is not activated before the writing circuitry has caused the voltage on said one of the bitlines in the pair to have reached the second voltage level. This significantly improves writeability, since it has been found that if the wordline is asserted whilst the writing circuitry is seeking to drive the voltage on the bitline to the second voltage level, components within the activated addressed memory cell will inhibit the action of the write circuitry. This will at the very least increase the time taken to transition the voltage to the second voltage level, and in some instances will actually prevent the writing circuitry being able to transition the voltage fully to the second voltage level. By delaying assertion of the wordline signal until after the writing circuitry has transitioned the voltage to the second voltage level, this then increases the effectiveness of the subsequent write assist mechanism by avoiding any part of that boost being effectively lost in completing the transition of the relevant bitline to the second voltage level.

Additionally, it has been found that by deferring assertion of the wordline signal until on or after the write assist enable signal is asserted, this prevents any parasitic read occurring in respect of the other bitline connected to the addressed memory cell. In particular, once the addressed memory cell has been activated, then the value stored in the bit cell prior to the write being completed may cause the voltage on the other bitline to begin to transition (in the same manner as would be expected if instead a read operation were being performed), and that would reduce the differential between the voltage on the two bitlines, hence reducing the writeability of the cell. By deferring assertion of the wordline signal until on or after the write assist enable signal is asserted, this prevents such a parasitic read effect from occurring whilst the writing circuitry is driving the voltage on one of the bitlines to the second voltage level.

There are a number of ways in which the control circuitry can be arranged to ensure that the wordline signal is not asserted until on or after the write assist enable signal is asserted. In one embodiment, the write assist enable signal generation circuitry is arranged to issue a delay control signal that is used to gate assertion of the wordline signal by the wordline driver circuitry until on or after the write assist enable signal is asserted.

In one embodiment, the delay control signal can be provided directly to the wordline driver circuitry, but in an alternative embodiment it can be used to gate another signal issued by the control circuitry to the wordline driver circuitry, to effectively delay the transmission of that signal to the wordline driver circuitry until the write assist enable signal is to be asserted, thereby causing assertion of the wordline signal to be delayed.

In one particular embodiment, the array of memory cells is partitioned into at least two portions that can be activated independently in accordance with a mask signal received by the wordline driver circuitry, and the delay control signal from the write assist enable signal generation circuitry is used to delay propagation of the mask signal to the wordline driver circuitry in order to prevent assertion of the wordline signal until on or after the write assist enable signal is asserted. By such an approach, the wordline driver circuitry does not require modifying in order to incorporate the above described technique, and instead all that is required is some minor modification to the control circuitry in order to defer transmission of one of the control signals to the wordline driver circuitry.

In one embodiment, the array of memory cells operate from a first supply voltage and the write driver circuitry operates from a second supply voltage, in at least some operating modes the second supply voltage being lower than the first supply voltage. The above described techniques are particularly beneficial in situations where the second supply voltage is lower than the first supply voltage, since it is those situations that the effectiveness of traditional write assist mechanisms tends to be compromised, due to the write assist mechanisms operating from the second supply voltage. By using the above described techniques, then even though the write assist mechanism continues to operate from the second supply voltage, significantly improved writeability of the memory cells can be achieved.

The bitline boosting mechanism can take a variety of forms. In one embodiment, the bitline boosting mechanism is a capacitive based bitline boosting mechanism employing a capacitive element coupled between said one of the bitlines and an input whose voltage is changed following assertion of the write assist enable signal, in order to drive the voltage on said one of the bitlines beyond the second voltage.

Whilst the direction in which the voltage is boosted by the bitline boosting mechanism can vary dependent on embodiment, in one particular embodiment the first voltage level is a supply voltage level, the second voltage level is a ground voltage level, and the bitline boosting mechanism is a negative bitline boosting mechanism to drive the voltage on said one of the bitlines to a negative voltage level in response to the write assist enable signal being asserted.

Particular embodiments will now be described with reference to the figures.

FIG. 1 is a block diagram schematically illustrating a memory device 10 in accordance with one embodiment. The memory device comprises an array of memory cells (also referred to herein as bit cells) 20 which is coupled with access circuitry 30 to enable read and write operations to be performed in respect of the bit cells. A cell voltage supply VDDCE is provided to the array of bit cells, whilst a peripheral voltage supply VDDPE is provided to the access circuitry 30. Both the access circuitry and the bit cells also have a ground connection. Whilst for simplicity in FIG. 1 all of the access circuitry associated with the bit cells is shown as connected to the peripheral voltage supply VDDPE, it will be understood that in some embodiments a certain amount of the access circuitry will actually be connected to the cell voltage supply VDDCE. For example, it is common for the wordline drivers used to activate addressed memory cells during read and write operations to be powered by the cell voltage supply VDDCE. Nevertheless, it is desirable to power as much as possible of the access circuitry from the peripheral voltage supply VDDPE, since in various modes of operation it will be possible to lower the peripheral voltage supply relative to the cell voltage supply, and accordingly significantly reduce power consumption. It is also possible in a state retention mode of operation to remove the peripheral voltage supply altogether, hence removing leakage current that might otherwise be associated with the access circuitry components that are connected to the peripheral voltage supply.

It is becoming more and more common for the peripheral voltage supply to be set lower than the cell voltage supply and this can give rise to some issues when performing access operations in respect of the bit cells. For example, when considering the performance of write operations in respect of the bit cells, as the process geometries used to construct the memory device reduce, the stability of the individual bit cells making up the memory device is reduced. Further, the writeability of those bit cells can be reduced, and it is known to provide write assist mechanisms that are invoked during the performance of a write operation to seek to improve the writeability of the bit cells. Typically the components forming the write assist mechanism will be provided within access circuitry components connected to the peripheral voltage supply. As the peripheral voltage supply is reduced relative to the cell voltage supply, then the larger the voltage difference between the two voltage supplies, the more this impacts the effectiveness of the write assist mechanism. For example, considering the particular example where the write assist mechanism takes the form of a capacitive based negative bitline boost (NBLB) mechanism, the assist related capacitance components are typically operated using the peripheral voltage supply and hence the strength of the boost that can be applied is reduced as the peripheral voltage supply reduces.

Further, when the addressed memory cells are connected to the bitlines during a write operation, since the internal transistors within the bit cells are driven from the higher cell voltage supply VDDCE, then the action of the transistors within the bit cells can inhibit the actions seeking to be performed by the write driver circuitry. For example considering the above situation where a negative bitline boost mechanism is used then, prior to the boost mechanism being invoked, writing circuitry within the write driver circuitry will be seeking to pull one of the bitlines connected to an addressed memory cell down to a ground voltage (representing a logic zero value). However, pull up components within the addressed memory cell may fight against the action of the writing circuitry, which may result in the voltage not being pulled down fully to the ground potential. This limits the effectiveness of the subsequent boost mechanism, since at least part of the boost applied is required to pull the voltage down to the ground potential, hence reducing the amount of any negative boost applied. This can significantly reduce the effectiveness of the write assist mechanism and in some instances, particularly where the relative voltage difference between the peripheral voltage supply and the cell voltage supply becomes larger, this can result in the memory cells not being able to be written to correctly.

As will be discussed further herein, the described embodiments provide a mechanism for delaying assertion of the wordline so that the assertion of the wordline is timed in dependence on the timing of a write assist enable signal used to invoke the write assist mechanism. This has been found to prevent certain effects arising during the write operation which can adversely affect the writeability of the addressed memory cell by deferring the point at which the addressed memory cell is actually activated in order to connect it to the bitlines. Further, it has been found that despite this delayed assertion of the wordline, the overall speed of the write operation is not adversely affected, since at the time the wordline is asserted, the differential on the bitlines is sufficient to enable the write to proceed very quickly.

Figure 2:
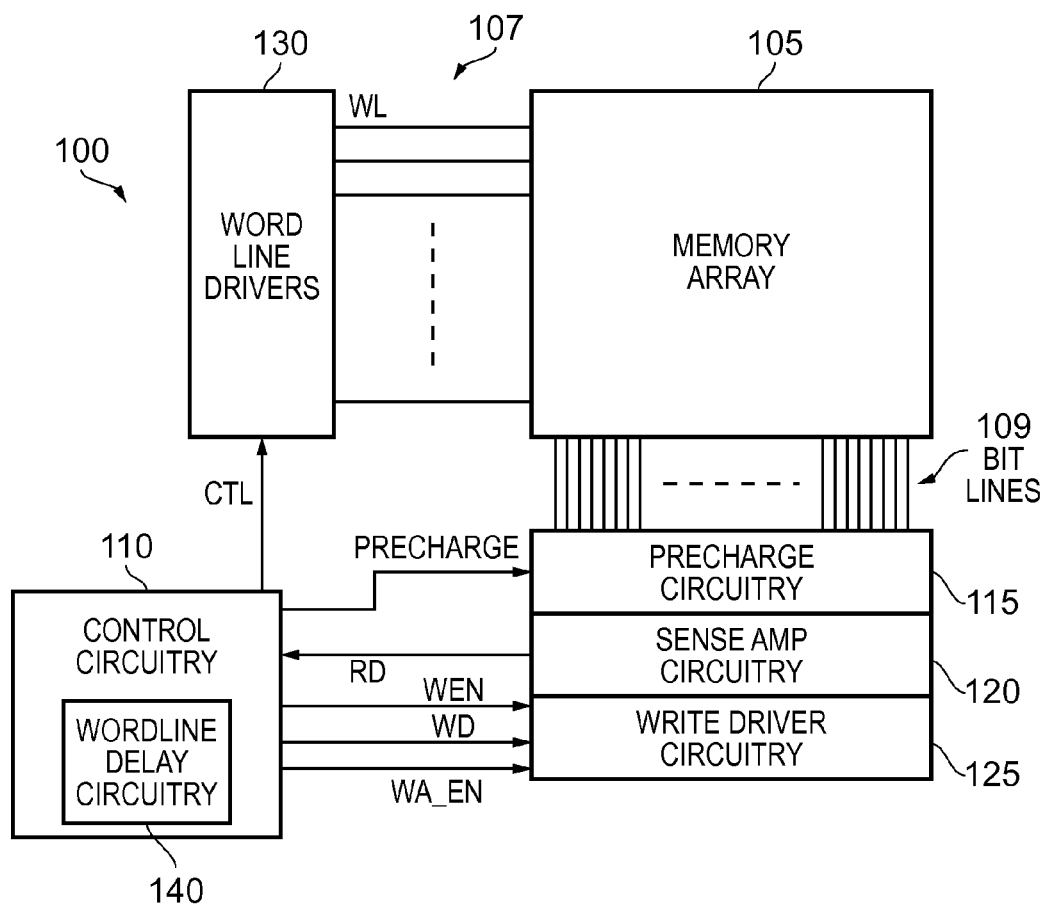
FIG. 2 is a block diagram schematically illustrating the logical arrangement of a memory device in accordance with one embodiment.

FIG. 2 is a diagram schematically illustrating a logical arrangement of a memory device in accordance with one embodiment. In particular, the memory device 100 includes a memory array 105 comprising an array of memory cells arranged in a plurality of rows and columns. A plurality of wordlines 107 are provided through the array in order to allow individual rows of addressed memory cells to be activated by the wordline drivers 130 during write and read operations. In addition, a plurality of bitlines 109 are provided in association with the columns of memory cells. Each column is coupled to the relevant bitlines to enable data to be written into an activated addressed memory cell of the column during a write operation, and for data to be read from an activated addressed memory cell of the column during a read operation.

Precharge circuitry 115 is used to precharge the voltage level on the bitlines under the control of control circuitry 110. Following the precharge operation, a write operation or read operation can be performed. For a write operation, the control circuitry 110 will issue one or more control signals to the wordline drivers 130 in order to cause a particular row of addressed memory cells to be activated via the associated wordline, and the control circuitry 110 will further cause the write driver circuitry 125 to control the voltages on the relevant bitline pairs, in order to cause the required data values to be written into the memory cells of the activated row. For a read operation, again the control circuitry 110 will issue one or more control signals to the wordline drivers 130 in order to cause a particular row of addressed memory cells to be activated via the appropriate wordline, and the sense amplifier circuitry 120 will then be used in order to evaluate the voltages on the relevant bitlines, with the sensed read data then being returned to the control circuitry 110.

The write driver circuitry 125 includes a write assist mechanism which is invoked during the performance of the write operation in response to an asserted write enable signal (WA_EN signal) issued by the control circuitry 110. Further, as will be described in more detail below, wordline delay circuitry 140 is provided which is arranged to ensure that the relevant wordline signal is not asserted by the wordline drivers 130 in order to activate the addressed memory cells until around the time the write assist enable signal is asserted. In one particular embodiment, the mechanism ensures that the wordline signal is asserted either substantially simultaneously with the write assist enable signal, or shortly following the write assist enable signal. Whilst in FIG. 2 the wordline delay circuitry 140 is shown as part of the control circuitry 110, in certain embodiments at least some of the components forming the wordline delay circuitry 140 may be provided within the wordline driver block 130.

Whilst FIG. 2 is intended to logically illustrate the arrangement of the memory device, it will be appreciated that it is not intended to provide an indication of the structural arrangement. For example, components such as the sense amplifier circuitry 120 and the precharge circuitry 115 may actually be embedded within blocks forming the memory array.

Figure 3:
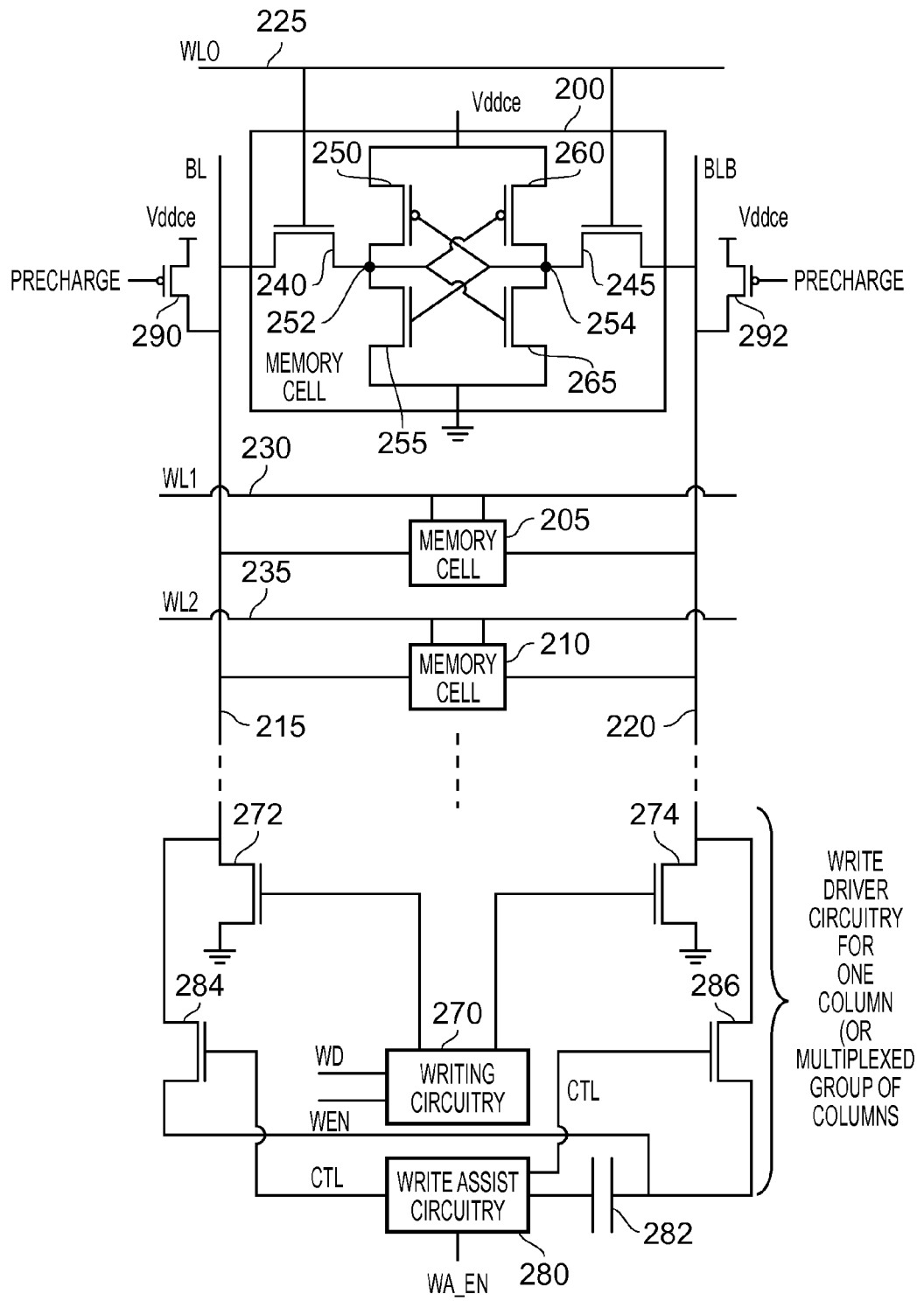
FIG. 3 schematically illustrates how a write operation is performed in respect of an addressed memory cell within a particular column of the memory array in accordance with one embodiment.

FIG. 3 is a diagram illustrating a column of memory cells 200, 205, 210 within the memory array 105, the column of memory cells being coupled to the pair of bitlines 215, 220. Each of the memory cells is coupled to an associated wordline 225, 230, 235, and when the wordline associated with one of the memory cells is asserted, this causes the memory cell to be connected to the corresponding bitlines. The detail of the memory cell 200 is shown, in this example it being assumed that the memory cell is a 6T SRAM cell. As shown, when the wordline signal is asserted on path 225, this turns on the pass gates 240, 245 and connects the storage element within the memory cell to the corresponding bitlines 215, 220. During any particular read or write operation, only one of the memory cells in the column will be activated in this manner, and then the voltages that develop on the bitlines can be sensed during a read operation, or the voltages on the bitline can be manipulated so as to perform a write operation. The storage element within the memory cell comprises two PMOS transistors 250, 260 and two NMOS transistors 255, 265. It will be appreciated that the arrangement of these transistors will ensure that the data value is determined by the values held at the two storage nodes 252, 254, one of those storage nodes being at a voltage representing a logic one value, and one of the storage nodes being at a voltage representing a logic zero value.

As shown in FIG. 3, precharge circuitry in the form of the precharge transistors 290, 292 is used to precharge the voltage on the bitlines 215, 220 to the cell voltage supply level VDDCE prior to the performance of either a read operation or a write operation. FIG. 3 then illustrates the components provided within the write driver circuitry in order to perform a write operation on an addressed memory cell within the column. In particular, writing circuitry 270 receives a write data (WD) value indicating the data value to be written into the addressed memory cell, and on receipt of an asserted write enable (WEN) signal evaluates the write data in order to determine the data value to be written into the addressed memory cell. It then determines which one of the pair of bitlines needs to be pulled down to a logic zero value in order to write the data value into the addressed memory cell and then issues suitable control signals to the NMOS transistors 272, 274, turning one of the NMOS transistors on in order to begin to discharge the relevant bitline towards the ground voltage. The write assist circuitry 280 is then provided to improve the writeability of the memory cell by seeking to boost the bitline that has been discharged to the ground potential so that its voltage goes slightly negative, hence increasing the differential between the voltage on that bitline and the other bitline. In particular, on receipt of a write assist enable signal, the write assist circuitry 280 issues appropriate control signals to the NMOS transistors 284, 286 in order to couple the bitline that is being discharged to the capacitor 282. At the other side of the capacitor, the voltage is then discharged from the peripheral voltage supply towards ground. Since the other side of the capacitor is connected to the bitline which has been discharged to the ground potential, this causes the voltage on that bitline to transition negative.

Figure 4A:
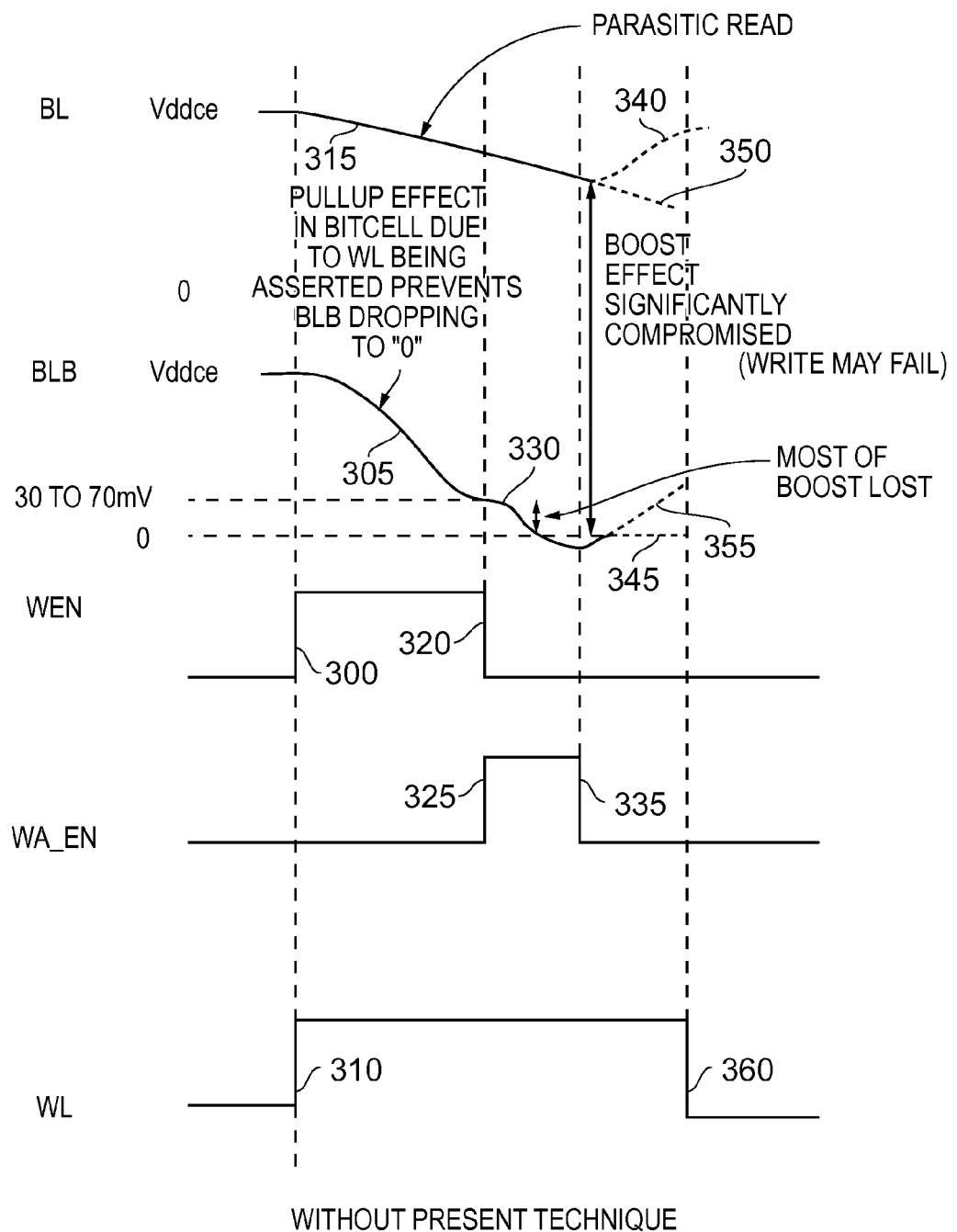
FIG. 4A is a timing diagram illustrating issues that can arise when not adopting the delayed wordline assertion technique of the described embodiments.

FIG. 4A is a timing diagram illustrating some problems that can arise when the wordline for the addressed memory cell is asserted in accordance with typical prior art arrangements, substantially at the same time as the write enable signal is issued to the writing circuitry. In particular, as shown in FIG. 4A, the write enable signal is asserted at point 300, and the wordline is asserted substantially simultaneously at point 310, hence activating the addressed memory cell in order to couple that memory cell to both bitlines. For the purposes of the following discussion, it will be assumed that the memory cell 200 is the addressed memory cell, that the internal node 252 is initially at a logic zero value, the internal node 254 is initially at a logic one value, and the data to be written into the memory cell requires that internal state to be flipped. As a result, the writing circuitry 270 will turn on the transistor 274, in order to begin to pull the bitline 220 towards the ground potential, as indicated by the transition 305 in FIG. 4A. However, since the wordline on path 225 has been asserted, and accordingly the internal node 254 is now connected to the bitline 220, the action of the pull-up PMOS transistor 260 will fight against the action of the writing circuitry, creating a DC path from the cell power supply VDDCE to ground. As shown in FIG. 4A, this prevents the voltage on the bitline 220 being pulled fully to ground during the operation of the writing circuitry, and in the particular example shown the voltage will be between 30 and 70 millivolts (mV) at the time the write enable signal is de-asserted at point 320. The write enable needs to be de-asserted prior to the write assist enable signal being asserted, since otherwise the negative boost seeking to be applied by the write assist circuitry will be lost to ground through the transistor 274.

Accordingly, as shown in FIG. 4A, the write enable signal is de-asserted at point 320, and then the write assist enable signal is asserted substantially simultaneously at step 325. This serves to apply a negative boost, as shown by the curve 330, but a significant proportion of that boost is actually utilised in seeking to draw the bitline 220 to ground, thereby significantly reducing the extent to which the bitline is pulled to a negative voltage during the write assist operation. Further, the pull-up effect through the PMOS transistor 260 will further impact the effective boost applied. As mentioned earlier, as the peripheral voltage supply reduces relative to the cell voltage supply, this weakens the effectiveness of the boost, and can further reduce the amount by which the voltage on the bitline 220 is reduced during the write assist operation. Indeed, in some situations it can still be the case that the voltage has not been pulled negative by the time the write assist mechanism has been performed.

Furthermore, as shown in FIG. 4A, due to the wordline being asserted throughout this period, a parasitic read effect can be observed on the other bitline (in this example the bitline 215). In particular, as discussed earlier, it is assumed that the initial value at the node 252 is a logic zero value. Accordingly, when the wordline is asserted and node 252 is connected to the bitline 215, the voltage on the bitline starts to be drawn towards ground (by essentially the same mechanism that occurs when performing a read operation), and this causes a reduction in the voltage on the bitline 215, as shown by the line 315 in FIG. 4A.

As a result, it can be seen that at the time the write assist mechanism has been implemented, i.e. when the write assist enable signal is de-asserted at point 335, the boost effect has been significantly compromised, and in particular the desirable degree of separation between the voltage levels on the two bitlines has not been achieved. In some instances, the write operation may still successfully occur, as a result of which the voltage on the bitline 215 will follow the trajectory 340 (i.e. be pulled back up to the VDDCE supply when the internal state of the addressed memory cell flips), and the voltage on the bitline 220 will settle at the logic zero value as shown by the trajectory 345. However, in other situations the amount of separation will be insufficient to cause the state of the memory cell to flip, and in that instance the voltage on the bitline 215 follows the trajectory 350 and the voltage on the bitline 220 follows the trajectory 355. As a result, the write operation will not be performed, and accordingly at the time the wordline is de-asserted at point 360, the write will have failed.

Figure 4B:
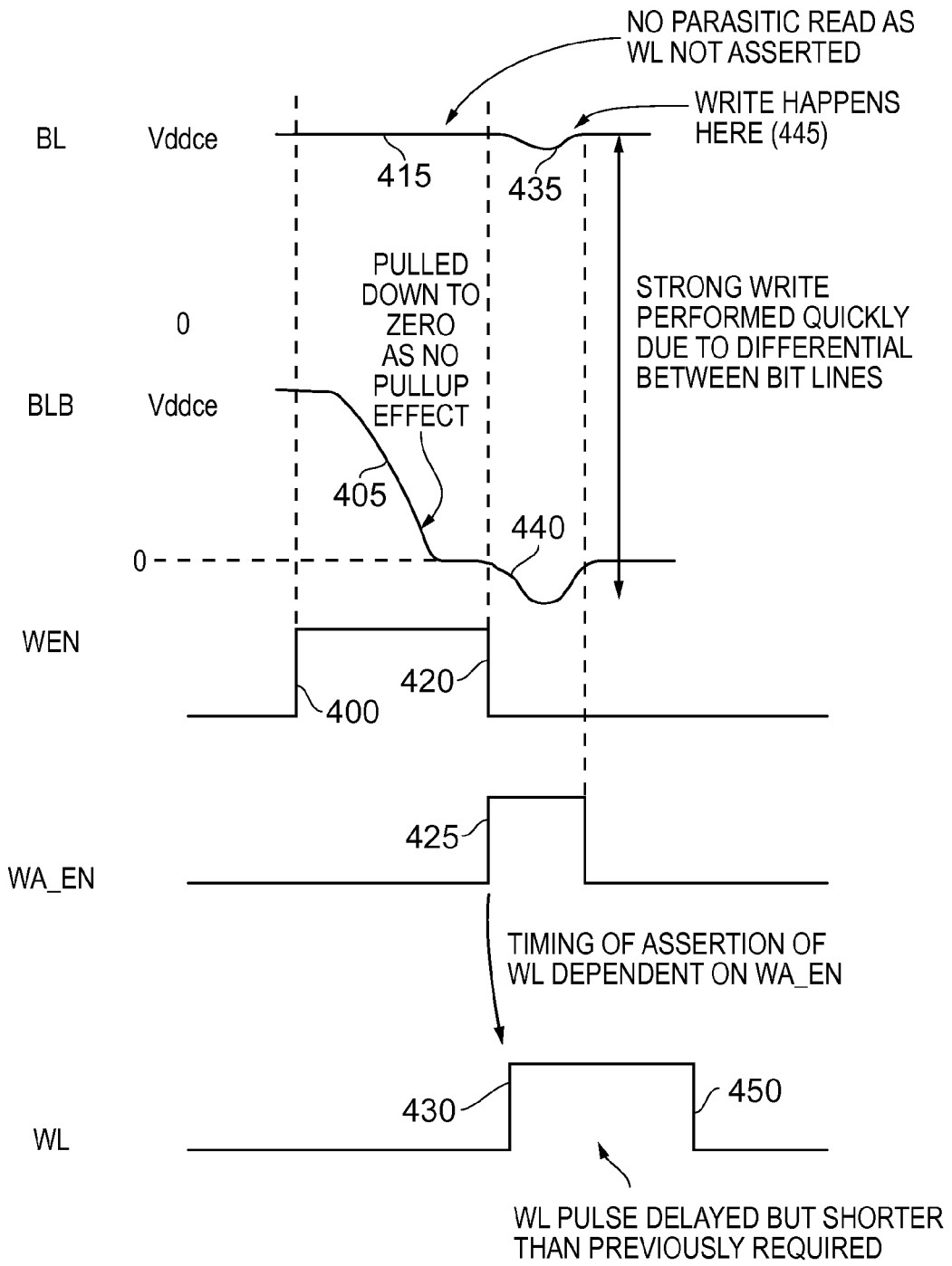
FIG. 4B is a timing diagram illustrating how the delayed wordline assertion technique of the described embodiments improves the writeability of the addressed memory cell.

FIG. 4B is an equivalent timing diagram, showing how delaying assertion of the wordline signal significantly improves writeability without impacting write performance. At point 400, the write enable signal is asserted, and in a similar way to that discussed with reference to FIG. 4A, this causes the voltage on the bitline 220 to be discharged towards ground, as shown by the line 405. Since at this point the wordline has not been asserted, then the addressed memory cell has not been activated, and is still decoupled from the bitline. Accordingly, the earlier mentioned DC path is avoided, and the writing circuitry 270, 274 is able to pull the bitline down to the zero voltage by the time the write enable signal is de-asserted at point 420. This means that when the write assist enable signal is asserted at point 425, the entirety of the negative boost applied via the capacitor 282 can be used to draw the bitline 220 to a negative voltage, as shown by the line 440.

In accordance with the described embodiments, the assertion of the wordline is made dependent on the assertion of the write assist enable signal. In particular, the wordline is not asserted until the write assist enable signal is asserted, and in the embodiment shown in FIG. 4B is actually asserted slightly after the write assist enable signal. As soon as the wordline is asserted at point 430, this can give rise to the beginning of a parasitic read effect on the bitline 215, as shown by the slight perturbation 435. However, due to the large separation that has been achieved between the two bitlines, this causes the activated addressed memory cell to flip its state very quickly and hence the write happens before the parasitic read has any appreciable effect (as shown by point 445). As hence shown the internal state of the addressed memory cell flips almost immediately following assertion of the wordline signal, and accordingly the bitline 215 remains at the VDDCE level, and the voltage on the bitline 220 then settles back to the logic zero value as now held at node 254 within the memory cell 200. The wordline can then be de-asserted at point 450.

Figure 4C:
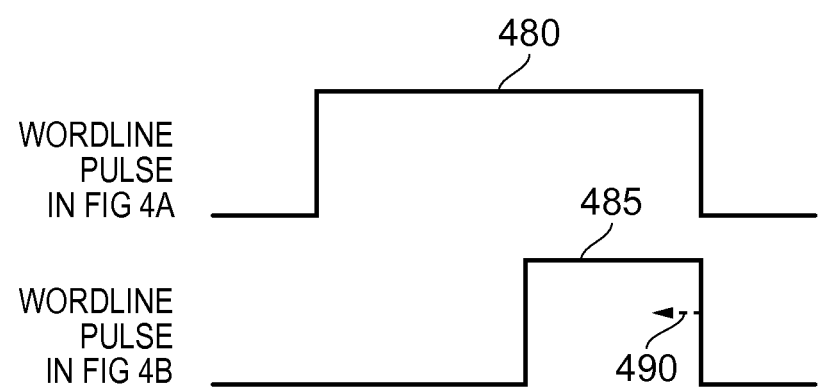
FIG. 4C illustrates how the wordline pulse width can be reduced when adopting the delayed wordline assertion technique of the described embodiments.

As will be apparent from a comparison of FIGS. 4A and 4B, in accordance with the technique described in FIG. 4B, the wordline pulse can be made significantly shorter. Indeed, this is shown schematically in FIG. 4C, where the wordline pulse in FIG. 4A 480 is activated significantly ahead of the wordline pulse 485 using the FIG. 4B approach. However, since the duration of the wordline pulse required when adopting the technique illustrated with reference to FIG. 4B can be relatively short, it is possible for the wordline to be de-asserted at a similar time to when the wordline pulse 480 would be de-asserted, and accordingly the late activation of the addressed memory cell does not affect the performance of the write operation. Indeed, as shown by the dotted line 490, it is actually possible in some embodiments for the wordline pulse to be de-asserted earlier than it would otherwise have been de-asserted, thereby giving rise to slight performance gains. Accordingly it can be seen that by adopting the delayed wordline assertion technique, not only can the writeability of the memory cells be significantly enhanced, but also this can be achieved without affecting write performance.

Figure 5:
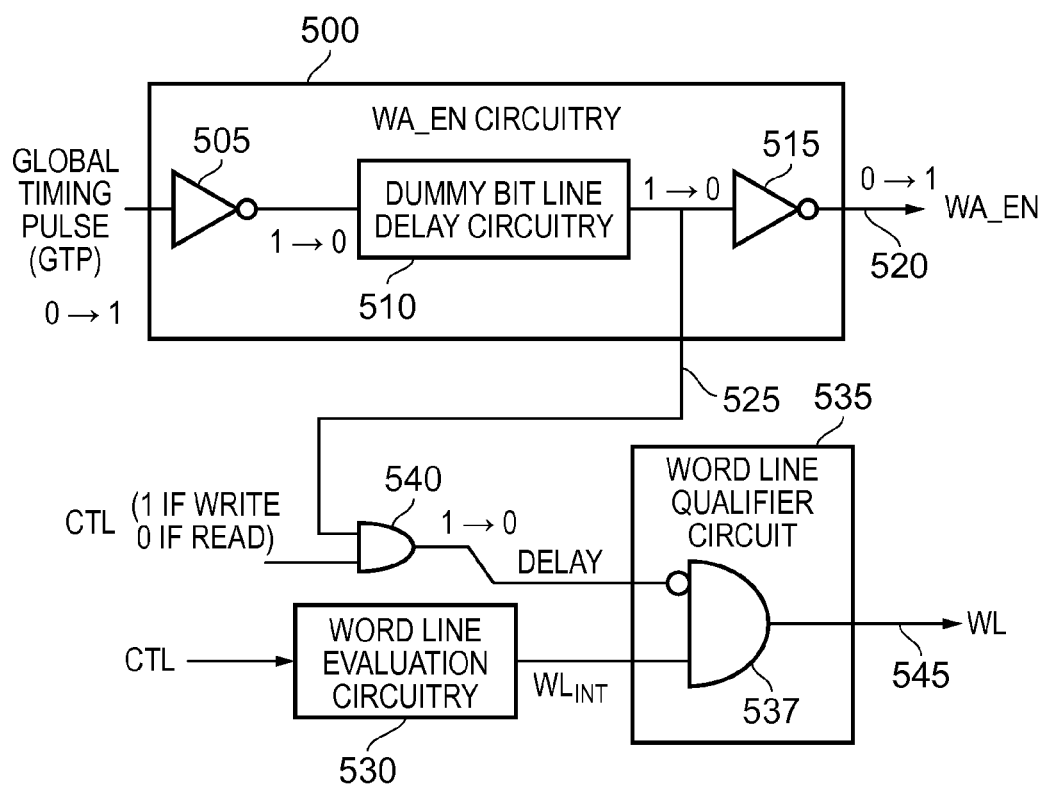
FIG. 5 is a diagram illustrating how the assertion of the wordline is delayed in accordance with one embodiment.

FIG. 5 is a diagram schematically illustrating how the delayed assertion of the wordline can be achieved in accordance with one embodiment. The write assist enable circuitry 500 is provided within the control circuitry 110 and is used to generate the write assist enable signal output over path 520 to the write driver circuitry 125. In response to a global timing pulse (GTP) transitioning from a logic zero value to a logic one value, the write assist enable circuitry 500 causes the write assist enable signal to be asserted at a logic one value following a predetermined delay. In particular, the GTP is passed through a series of inverters 505, 515, but also through a dummy bitline delay circuit 510. The dummy bitline delay circuit 510 is constructed so as to mimic the loading of an actual bitline within the memory array, and accordingly is configured to track with the memory array height (i.e. the number of bit cells connected to a particular bitline). This hence takes account of the time it will take for the writing circuitry to pull the voltage on the bitline from the precharged VDDCE level down to the ground level.

Additionally, as shown in FIG. 5, the output from the dummy bitline delay circuitry is provided over path 525 as a delay control signal used to qualify assertion of the wordline signal by the wordline driver circuitry. In particular, the wordline driver circuitry will include a wordline evaluation circuit 530 which is responsive to various control signals received from the control circuitry to determine which wordline should be asserted. That asserted wordline is output as an internal asserted wordline signal to a wordline qualifying circuit 535. As shown, when the delay control signal output over path 525 transitions to a logic zero value, this will cause the upper input to the AND gate 537 to be set to a logic one value (due to the inversion at the input), and accordingly when the internal wordline signal is asserted (at a logic one level), this will then cause the asserted wordline to be output over path 545 to the memory array.

The AND gate 540 is provided as a mechanism to ensure that assertion of the wordline is not delayed for read operations, but instead is only delayed for write operations. This hence ensures that the performance of read operations (where it is desired to have an early wordline assertion) is not affected. In particular, as shown, the lower input to the AND gate 540 is set to a logic one value for a write, hence ensuring that the signal on line 525 is provided to the wordline qualifying circuit. Conversely, that lower input is set to a logic zero value for a read, hence ensuring that the upper input to the AND gate 535 is always at a logic one value during the read, and accordingly when the wordline evaluation circuitry 530 asserts a wordline it is output immediately over path 545.

In the arrangement shown in FIG. 5, the wordline qualifier circuit represents additional components that will typically need to be provided within the wordline drivers 130 in order to implement the wordline delay circuitry functionality. However, as will be described later with reference to FIGS. 7A and 7B, there are other embodiments where it is not necessary to alter the wordline driver circuitry, and instead additional components provided within the control circuitry can be used to achieve the desired delay in the assertion of the wordline.

Figure 6:
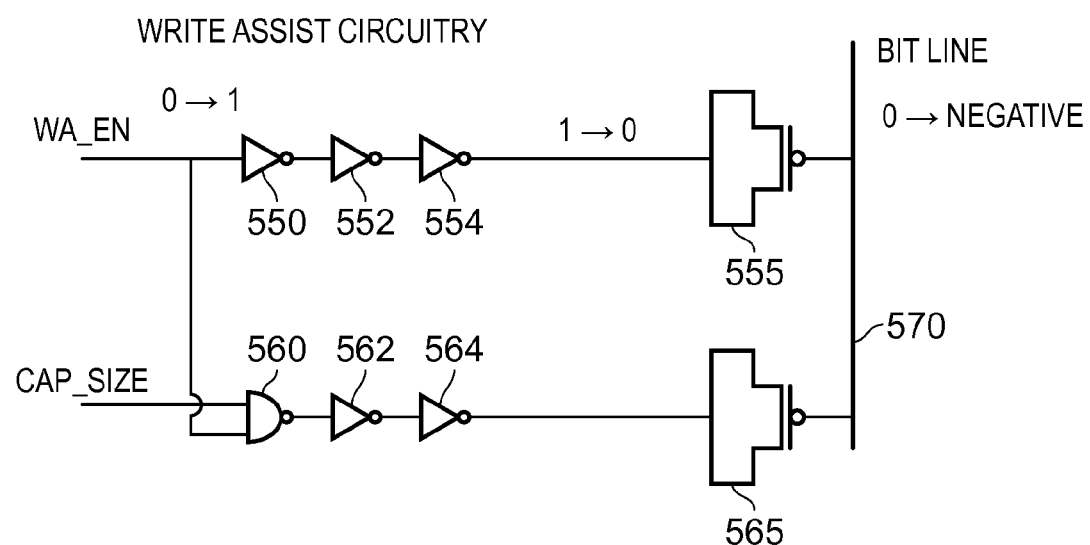
FIG. 6 is a diagram schematically illustrating how the write assist circuitry implements a capacitive bitline boost in response to an asserted write assist enable signal in accordance with one embodiment.

FIG. 6 schematically illustrates write assist circuitry provided within the write driver circuitry 125, and in particular shows components used to control the negative boost applied by the capacitive components of the write assist circuitry. In this example, the write assist enable signal is passed through a series of inverters 550, 552, 554, and as a result when the write assist enable signal is asserted, the input to the capacitive element 555 reduces from a voltage representing a logic one value to a voltage representing a logic zero value. Assuming the bitline 570 is already at a logic zero value, it will be understood that this will hence drive the voltage negative on the bitline.

Optionally, one or more additional capacitive elements 565 can be provided which can be used to increase the strength of the bitline boost dependent on a cap_size control signal. In particular, when the cap_size signal is a set to a logic one value, it will be appreciated that the operation of the NAND gate 560 and the inverters 562, 564 ensures that the capacitive element 565 also contributes to drawing the bitline to a negative voltage. Such an approach hence allows tuning of the boost amount, for example to take account of process, voltage and temperature (PVT) variations.

Figure 7A:
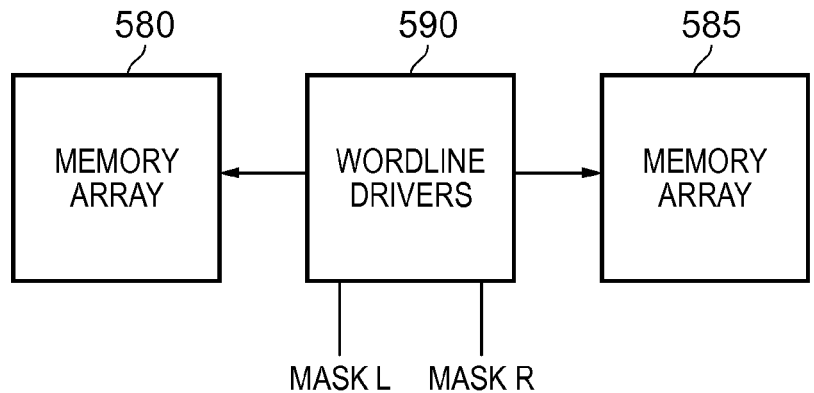
FIG. 7A schematically illustrates a split memory array approach in accordance with one embodiment.
Figure 7B:
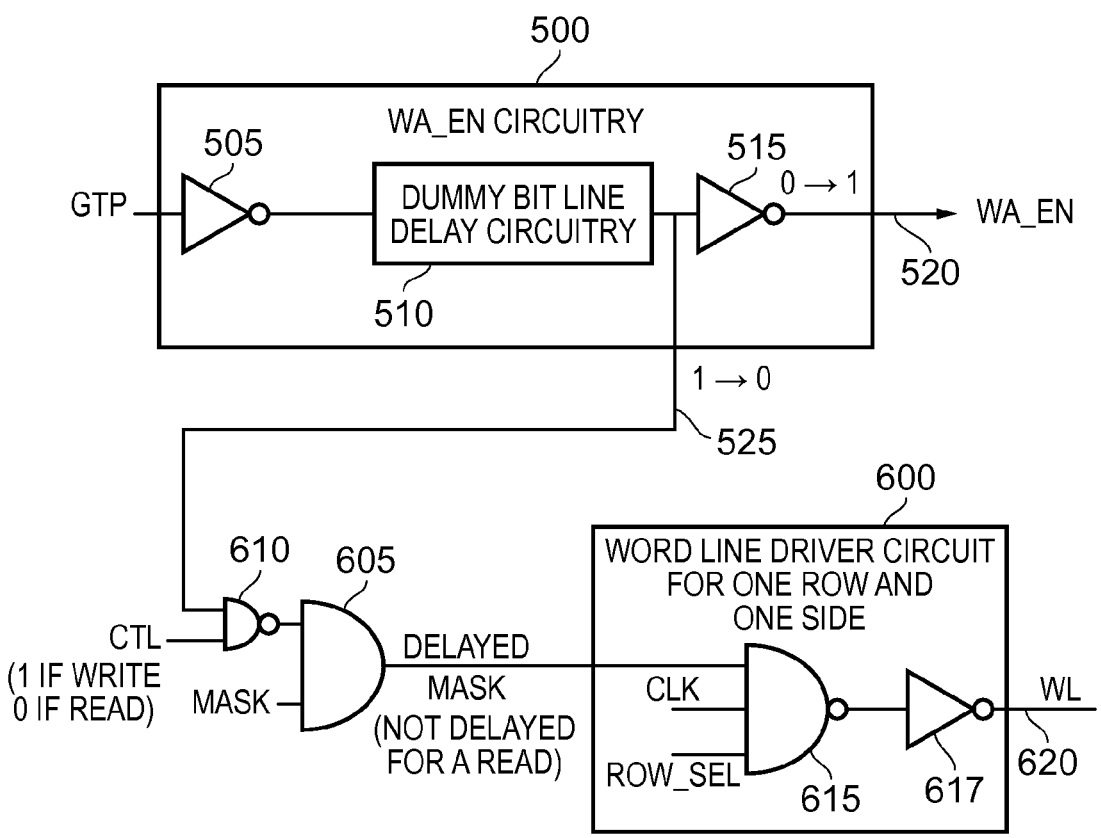
FIG. 7B is a block diagram illustrating how the assertion of the wordline may be delayed in one embodiment employing the split memory array approach of FIG. 7A.

In some arrangements, the memory array may be partitioned into multiple segments (or portions), as shown for example in FIG. 7A where the memory array is formed by the left hand segment 580 and the right hand segment 585. Mask signals issued from the control circuitry to the wordline drivers 590 can be used to determine which memory array segment is to be addressed by a particular read or write operation. In one embodiment, the control circuitry can include wordline delay circuitry in order to defer propagation of the relevant mask signal to the wordline driver circuitry until the write assist enable signal is asserted, thereby causing the assertion of the wordline to be delayed without needing to modify the wordline driver circuitry. In particular, the write assist enable circuitry shown in FIG. 7B is as discussed earlier in FIG. 5, and again results in the delay control signal being output over path 525, that delay control signal transitioning towards a logic zero value around the time the write assist enable signal is to be asserted.

The wordline driver circuit 600 consists of a three input NAND gate receiving a clock signal, a row select signal and a mask value output from the control circuitry. Only when all three inputs are set to a logic one value will a logic zero value be output from the NAND gate and accordingly will the wordline be asserted at a logic one value over path 620 (as a result of the inverter 617).

Within the control circuitry, the AND gate 605 can be provided so as to gate the propagation of the mask signal to the wordline driver circuitry dependent on the delay control signal from the write assist enable circuitry 500. The NAND gate 610 serves a similar function to the AND gate 540 in FIG. 5, and in particular ensures that the delay only applies during a write operation and not a read operation. In particular, the control input to the NAND gate 610 is set to a logic one value for a write, ensuring that the upper input to the AND gate 605 only transitions to a logic one value once the delay control value transitions to a logic zero value, hence delaying propagation of the mask signal to the wordline driver circuit 600. However, for a read, the control input to the NAND gate 610 is set to a logic zero value, ensuring that the upper input to the AND gate 605 is at a logic one value, hence avoiding any delay in propagation of the mask signal to the wordline driver circuit 600.

Figure 8:
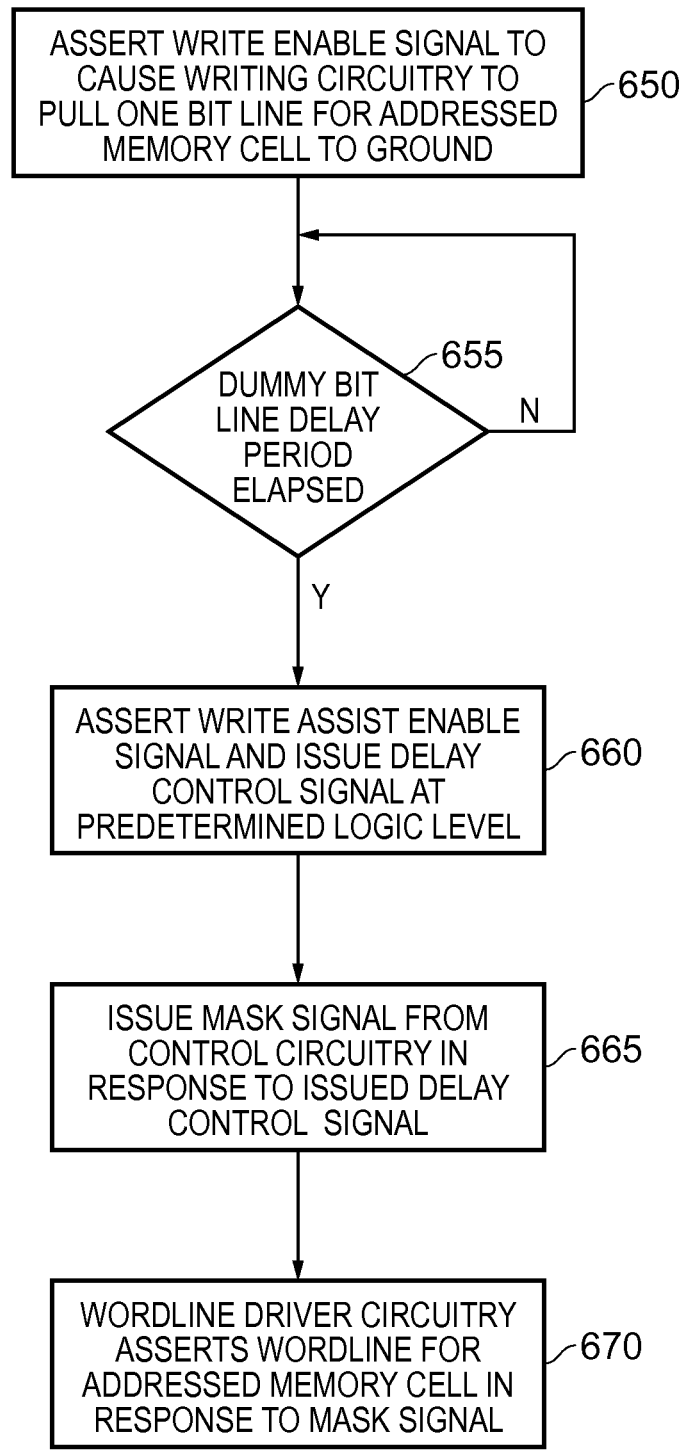
FIG. 8 is a flow diagram illustrating the operation of the memory device when performing a write operation in accordance with one embodiment.

FIG. 8 is a flow diagram illustrating the steps performed in order to implement a write operation in accordance with one embodiment. At step 650, the write enable signal is asserted in order to cause the writing circuitry 270 to pull one bitline connected to an addressed memory cell towards ground. At step 655, it is determined whether the dummy bitline delay period has elapsed, this determination forming part of the operation of the write assist enable circuitry 500. Once the dummy bitline delay period has elapsed, it will be expected that the voltage on the relevant bitline has been pulled to ground, and thereafter, at step 660, the write assist enable signal is asserted, and also the delay control signal is issued from the write assist enable circuitry at a predetermined logic level (i.e. at a logic zero value considering the examples of FIGS. 5 and 7B).

The assertion of the write assist enable signal will cause the write assist mechanism to be invoked as discussed earlier. In addition, the issuance of the delay control signal at the predetermined logic level will allow the wordline driver circuitry to assert the wordline signal. Considering the particular example of FIG. 7B, at step 665, the control circuitry will then issue a mask signal in response to the issued delay control signal, and at step 670 the wordline driver circuitry will then assert the wordline for the addressed memory cell in response to receipt of the asserted mask signal.

Figure 9:
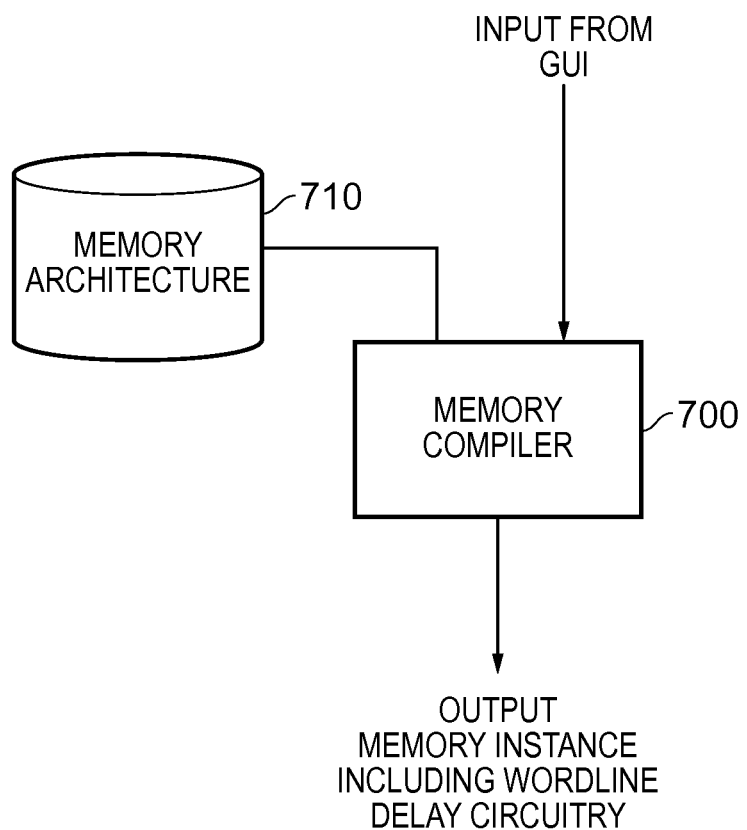
FIG. 9 is a diagram schematically illustrating the operation of a memory compiler to generate a memory instance including wordline delay circuitry of the described embodiments.

FIG. 9 schematically illustrates how a memory instance including wordline delay circuitry in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 700 then generates the required memory instance based on the input parameters and the memory architecture 710. In accordance with one embodiment, the memory compiler includes the necessary components to implement the wordline delay circuitry as described with reference to the earlier figures.

Figure 10:
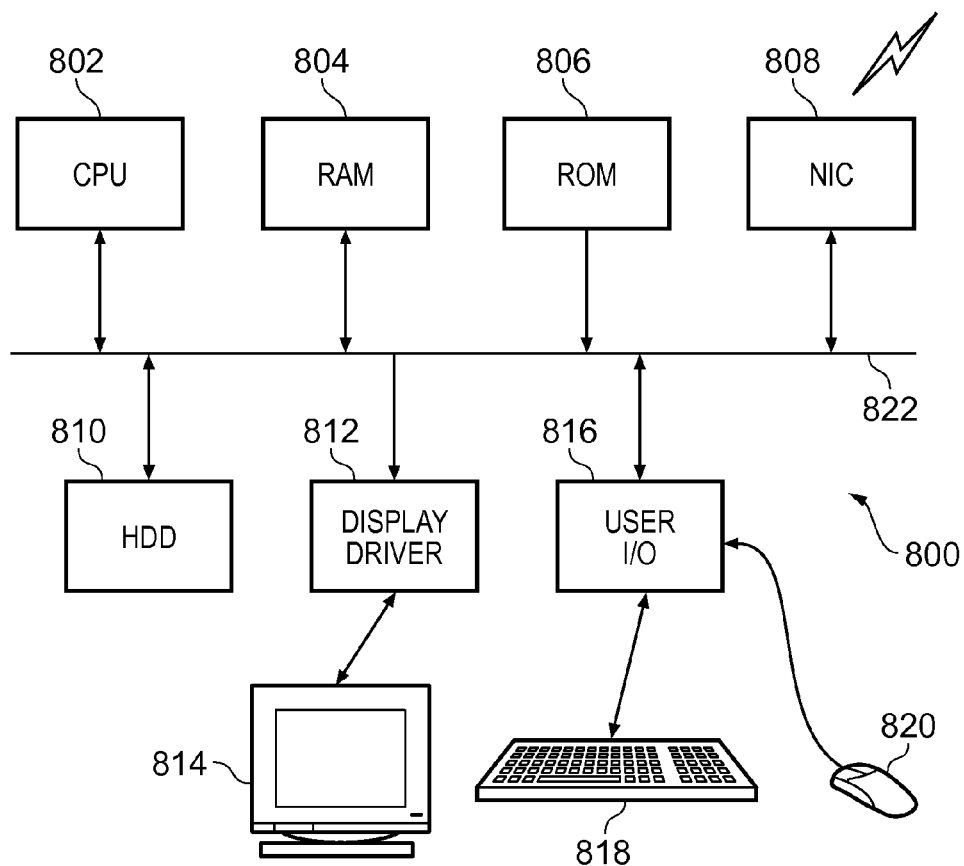
FIG. 10 is a diagram of a computer system on which a memory compiler operation may be performed to generate a memory instance conforming to the above described embodiments.

FIG. 10 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could vary considerably and FIG. 10 is only one example.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

From the above described embodiments, it will be seen that by controlling the timing of assertion of the wordline signal in dependence on the timing of the write assist enable signal, this allows the writeability of addressed memory cells to be significantly improved. Furthermore, even though the assertion of the wordline signal is delayed, it has been found that this benefit can be achieved without adversely affecting the performance of the memory device. By not having the wordline asserted whilst the write enable signal is asserted, this avoids any parasitic read on the bitline that is not being discharged by the writing circuitry, which leads to lower dynamic energy during the write operation. In addition, it ensures that the writing circuitry can fully pull the voltage down to ground, so that when the write assist mechanism is subsequently invoked, it can be used to full effect to further increase the differential between the voltage on the two bit-lines. As discussed earlier, this means that when the wordline is asserted, the write proceeds very quickly. As a result, a shorter wordline pulse width is required, and this leads to lower dynamic energy and lower stability failure probability within the memory cells. It has been found that the approach further reduces the potential stress on the bitline pass gates as only the required boost amount will be present on the bitline (once the cell flips the charge is instantly discharged through the bit cell pull down component).

Further, the techniques of the described embodiments can be implemented with very little additional circuitry, and hence very little cost in terms of area.

Furthermore, since the write assist enable signal is designed to track with the bit cell array height (in order to ensure that the boost mechanism is triggered after the bitline is fully discharged), and since the assertion of the wordline signal is dependent on assertion of the write assist enable signal, this ensures that the wordline delay minimally impacts performance (since there will be less delay for smaller memory instances and more delay for larger memory instances).

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. A memory device comprising:
    an array of memory cells;
    wordline driver circuitry to assert a wordline signal to activate an addressed memory cell in the array;
    write driver circuitry to perform a write operation to write a data value into the addressed memory cell, the write driver circuitry being responsive to assertion of a write enable signal to initiate performance of the write operation and being responsive to later assertion of a write assist enable signal during the write operation to implement a write assist circuitry; and control circuitry to control timing of assertion of the wordline signal in dependence on timing of the assertion of the write assist enable signal.

2. A memory device as claimed in claim 1, wherein the control circuitry is arranged to assert the wordline signal on or after the write assist enable signal is asserted.

3. A memory device as claimed in claim 1, wherein:
the addressed memory cell is connected to at least one bitline;
the write driver circuitry performs the write operation by controlling a voltage on the at least one bitline; and
the write assist circuitry is a bitline boosting circuitry.

4. A memory device as claimed in claim 1, wherein the array of memory cells operate from a first supply voltage and the write driver circuitry operates from a second supply voltage, in at least some operating modes the second supply voltage being lower than the first supply voltage.

5. A non-transitory computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device as claimed in claim 1.

6. A memory device comprising:
an array of memory cells;
wordline driver circuitry to assert a wordline signal to activate an addressed memory cell in the array;
write driver circuitry to perform a write operation to write a data value into the addressed memory cell, and responsive to assertion of a write assist enable signal during the write operation to implement a write assist circuitry; and
control circuitry to control timing of assertion of the wordline signal in dependence on timing of assertion of the write assist enable signal;
wherein:
the addressed memory cell is connected to a pair of bitlines;
the write driver circuitry performs the write operation by controlling a voltage on at least one of the bitlines;
the write assist circuitry is a bitline boosting circuitry; and
the write driver circuitry comprises writing circuitry to drive a voltage on one of the bitlines in the pair from a first voltage level to a second voltage level during the writing operation and write assist circuitry responsive to the write assist enable signal to implement the bitline boosting circuitry to drive the voltage on said one of the bitlines beyond the second voltage level so as to increase a voltage difference between the voltage level on said one of the bitlines and said first voltage level.

7. A memory device as claimed in claim 6, wherein said first voltage level is a precharge voltage level to which both bitlines in the pair are precharged prior to the write operation.

8. A memory device as claimed in claim 6, wherein the control circuitry comprises write assist enable signal generation circuitry to time assertion of the write assist enable signal so as to ensure that the writing circuitry will have caused the voltage on said one of the bitlines in the pair to have reached the second voltage level before the write assist enable signal is asserted.

9. A memory device as claimed in claim 8, wherein the write assist enable generation circuitry comprises dummy bitline circuitry to introduce a delay in the assertion of the write assist enable signal to take account of the time taken for the writing circuitry to drive the voltage on said one of the bitlines from the first voltage level to the second voltage level.

10. A memory device as claimed in claim 8, wherein the control circuitry asserts the wordline signal on or after the write assist enable signal is asserted, thereby ensuring that the addressed memory cell is not activated before the writing circuitry has caused the voltage on said one of the bitlines in the pair to have reached the second voltage level.

11. A memory device as claimed in claim 8, wherein the control circuitry asserts the wordline signal on or after the write assist enable signal is asserted, thereby preventing a parasitic read in respect of the other bitline in the pair whilst the writing circuitry is driving the voltage on said one of the bitlines in the pair to the second voltage level.

12. A memory device as claimed in claim 8, wherein the write assist enable signal generation circuitry is arranged to issue a delay control signal that is used to gate assertion of the wordline signal by the wordline driver circuitry until on or after the write assist enable signal is asserted.

13. A memory device as claimed in claim 12, wherein the array of memory cells is partitioned into at least two portions that can be activated independently in accordance with a mask signal received by the wordline driver circuitry, and the delay control signal from the write assist enable signal generation circuitry is used to delay propagation of the mask signal to the wordline driver circuitry in order to prevent assertion of the wordline signal until on or after the write assist enable signal is asserted.

14. A memory device as claimed in claim 6, wherein the bitline boosting circuitry is a capacitive based bitline boosting circuitry employing a capacitive element coupled between said one of the bitlines and an input whose voltage is changed following assertion of the write assist enable signal, in order to drive the voltage on said one of the bitlines beyond the second voltage.

15. A memory device as claimed in claim 6, wherein:
said first voltage level is a supply voltage level;
said second voltage level is a ground voltage level; and
said bitline boosting circuitry is a negative bitline boosting circuitry to drive the voltage on said one of the bitlines to a negative voltage level in response to the write assist enable signal being asserted.

16. A method of performing a write operation within a memory device having an array of memory cells, comprising:
employing wordline driver circuitry to assert a wordline signal to activate an addressed memory cell in the array;
performing the write operation to write a data value into the addressed memory cell, the write operation being initiated responsive to assertion of a write enable signal;
responsive to later assertion of a write assist enable signal during the write operation, implementing a write assist circuitry; and
controlling timing of assertion of the wordline signal in dependence on timing of the assertion of the write assist enable signal.

* * * * *